United States Patent [19]

Kashiwagi

[11] Patent Number: 4,661,995
[45] Date of Patent: Apr. 28, 1987

[54] MULTI-SUPERHETERODYNE RECEIVER

[75] Inventor: Toshihiro Kashiwagi, Ebina, Japan

[73] Assignee: Anritsu Electric Co., Limited, Tokyo, Japan

[21] Appl. No.: 906,580

[22] Filed: Sep. 9, 1986

Related U.S. Application Data

[63] Continuation of Ser. No. 703,650, Feb. 21, 1985, abandoned.

[51] Int. Cl.⁴ .............................................. H04B 1/26
[52] U.S. Cl. .................................... 455/183; 455/186; 455/315; 455/317
[58] Field of Search ............................... 455/183–186, 455/165, 166, 207–209, 314–316, 317; 331/2, 18, 22

[56] References Cited

U.S. PATENT DOCUMENTS

| | | | |
|---|---|---|---|
| 3,988,681 | 10/1976 | Schurmann | 455/184 |
| 4,075,567 | 2/1978 | Klank et al. | 455/184 |
| 4,355,412 | 10/1982 | Kawakami | 455/186 |
| 4,545,072 | 10/1985 | Skutta et al. | 455/315 |
| 4,551,856 | 11/1985 | Victor et al. | 455/316 |

FOREIGN PATENT DOCUMENTS

| | | |
|---|---|---|
| 3200560 | 7/1983 | Fed. Rep. of Germany . |
| 8404637 | 11/1984 | World Int. Prop. O. . |
| 1094653 | 12/1967 | United Kingdom . |

Primary Examiner—Jin F. Ng
Attorney, Agent, or Firm—Frishauf, Holtz, Goodman & Woodward

[57] ABSTRACT

A multi-superheterodyne receiver having a first local oscillator for generating a first local frequency signal, a first frequency converter for converting to a first intermediate frequency signal a received signal in response to the first local frequency signal, a second local oscillator for generating a second local frequency signal, a second frequency converter for converting to a second intermediate frequency signal the first intermediate frequency signal in response to the second local frequency signal, includes judging circuitry for judging if a residual spurious component is generated when harmonic waves of at least one of the local frequency signals are at certain frequencies. Control circuitry shifts the first local frequency signal by a first predetermined frequency to cause the first intermediate frequency signal to suppress the residual spurious component, and shifts the second local frequency signal by a second predetermined frequency to maintain the frequency of the second intermediate frequency signal constant, when the judging circuitry determines that a residual spurious component will be generated at a preset receiving frequency. Thus, intermodulation disturbances in the receiver are suppressed.

2 Claims, 7 Drawing Figures

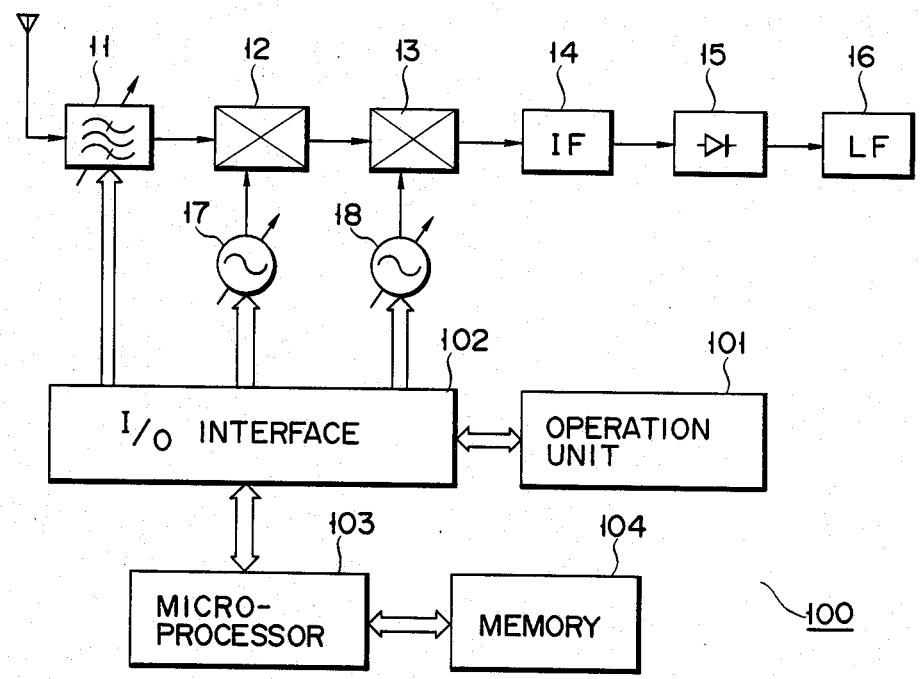
F I G. 2

MULTI-SUPERHETERODYNE RECEIVER

This application is a continuation of application Ser. No. 703,650 filed Feb. 21, 1985, now abandoned.

BACKGROUND OF THE INVENTION

This invention relates to a multi-superheterodyne receiver and, more particularly, to an improved receiver for removing residual spurious components so as to prevent reception interference.

In a receiver for receiving broadcast waves or for measuring an electric field intensity, double-superheterodyne reception is used. In this process, received waves are subjected to frequency conversion by first and second frequency converters. This process provides a high degree of wave selectivity and allows reception of weak waves without radio interference.

FIG. 1 shows a block diagram of a receiver to which such double-superheterodyne reception has been adapted. Referring to FIG. 1, reference numeral 1 denotes a high-frequency filter; 2, a first frequency converter; 3, a second frequency converter; 4, an intermediate frequency amplifier; 5, a detector; and 6, a low-frequency amplifier. First and second local oscillators 7 and 8 generate signals which are supplied to the first and second frequency converters 2 and 3. The first and second frequency converters 2 and 3 generate first and second intermediate frequencies fi1 and fi2.

When the frequency of a received wave is represented by f and the local frequency of the first local oscillator 7 is represented by fL1, the first intermediate frequency fi1 is given by: fL1−f=fi1. Similarly, when the local frequency of the second local oscillator 8 is represented by fL2, the second intermediate frequency fi2 is given by: fL2−fi1=fi2.

When two oscillators are present in a single receiver, they tend to couple electromagnetically at a common circuit portion despite shielding. This coupling generates a radio frequency component which causes radio interference.

In a receiver having a receiving frequency band of 300 to 550 MHz, when the first intermediate frequency fi1 is set at 199.75 MHz, the local frequency fL1 of the first local oscillator 7 must fall within a range of 499.75 to 749.75 MHz. At this time, when the second intermediate frequency fi2 is set at 10.7 MHz, the local frequency fL2 of the second local oscillator 8 becomes 210.45 MHz.

In this case, when the receiving frequency is 321.025 MHz, for example, the local frequency fL1 of the first local oscillator 7 becomes 321.025+199.75=520.775 MHz. When the difference between a harmonic frequency which is twice this frequency and a harmonic frequency which is four times the local frequency of the second local oscillator 8 is calculated in accordance with 1041.55−841.8=199.75 MHz, the first intermediate frequency fi1 is obtained by mutual interference between the harmonic waves and the fundamental waves of the local frequencies fL1 and fL2 of the first and second local oscillators 7 and 8. Thus, when fi1=±(mfL1−nfL2) is established, residual spurious noise is generated, and beat reception or the like is caused.

In measurement of received waves, a residual spurious component may be erroneously detected as a received wave.

A description has been made with reference to an actual example of specifications in the case of residual spurious component in a double-superheterodyne receiver. However, in other frequency setttings, at least one residual spurious component is frequently generated in a single receiving band causing reception interference or erroneous reception.

This tendency is more notable in a multi-superheterodyne receiver having two or more intermediate frequencies.

SUMMARY OF THE INVENTION

It is, therefore, an object of the present invention to provide a new and improved multi-superheterodyne receiver in which a residual spurious component is effectively removed and reception interference is prevented.

According to the present invention, a multi-superheterodyne receiver includes a first local oscillator for generating a first local frequency signal, a first frequency converter for converting a first intermediate frequency signal from a received signal and said first local frequency signal, a second local oscillator for generating a second local frequency signal, a second frequency converter for converting to a second intermediate frequency signal said first intermediate frequency signal in response to said second local frequency signal, judging means for judging if a residual spurious component will be generated when harmonic waves of at least one of said local frequency signals are at certain frequencies, and control means for shifting the frequency of said first local frequency signal by a first predetermined frequency to cause the first intermediate frequency signal to suppress the residual spurious component, and shifting the frequency of said second local frequency signal by a second predetermined frequency to maintain the frequency of said second intermediate frequency signal constant, when said judging means judges that a residual spurious component will be generated at a preset receiving frequency.

BRIEF DESCRIPTION OF THE DRAWINGS

These and other objects and features of the present invention can be understood by reference to the accompanying drawings, in which:

FIG. 2 is a block diagram showing the configuration of a multi-superheterodyne receiver according to a first embodiment of the present invention;

DETAILED DESCRIPTION OF THE PREFERRED EMBODIMENTS

Figure 1:
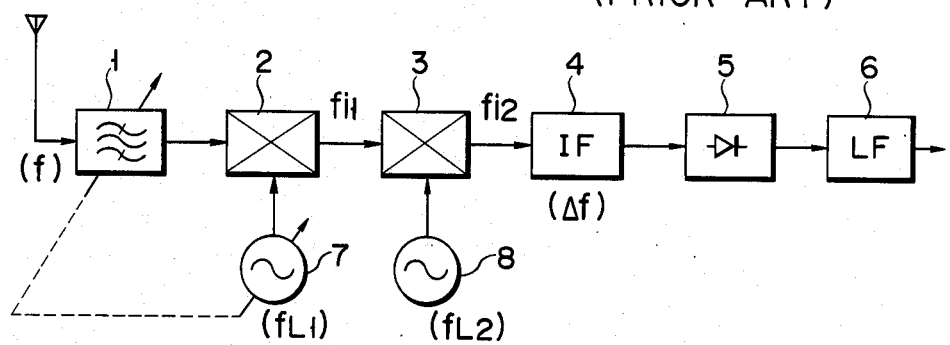
FIG. 1 is a block diagram of a conventional double-superheterodyne receiver.

FIG. 2 shows a first embodiment of the present invention applied to a double-superheterodyne receiver. Referring to FIG. 2, reference numeral 11 denotes a high-frequency filter; 12, a first frequency converter; 13, second frequency converter; 14, an intermediate frequency amplifier; 15, a detector; and 16, a low-frequency amplifier. First and second local oscillators 17 and 18 generate signals which are supplied to the first and second frequency converters 12 and 13. The first and second frequency converters 12 and 13 generate first and second intermediate frequencies fi1 and fi2 under the control of a controller 100 to be described later.

The controller 100 has an operation unit 101 which, in turn, has operating elements such as a receiving frequency setting dial or keys; an input/output (I/O) interface 102 for coupling the operation unit 101, a microprocessor 103 to be described later, the high-frequency amplifier 11, and the first and second local oscillators 17 and 18; and a memory 104 such as a read only memory (ROM) storing program data for operating the microprocessor 103, and receiving frequency data at which a residual spurious component is expected to occur and which is calculated in advance.

The first and second local oscillators 17 and 18 have variable capacitive elements (not shown) such as diodes for shifting the local frequencies fL1 and fL2 by $2\Delta f$, respectively.

Figure 3:
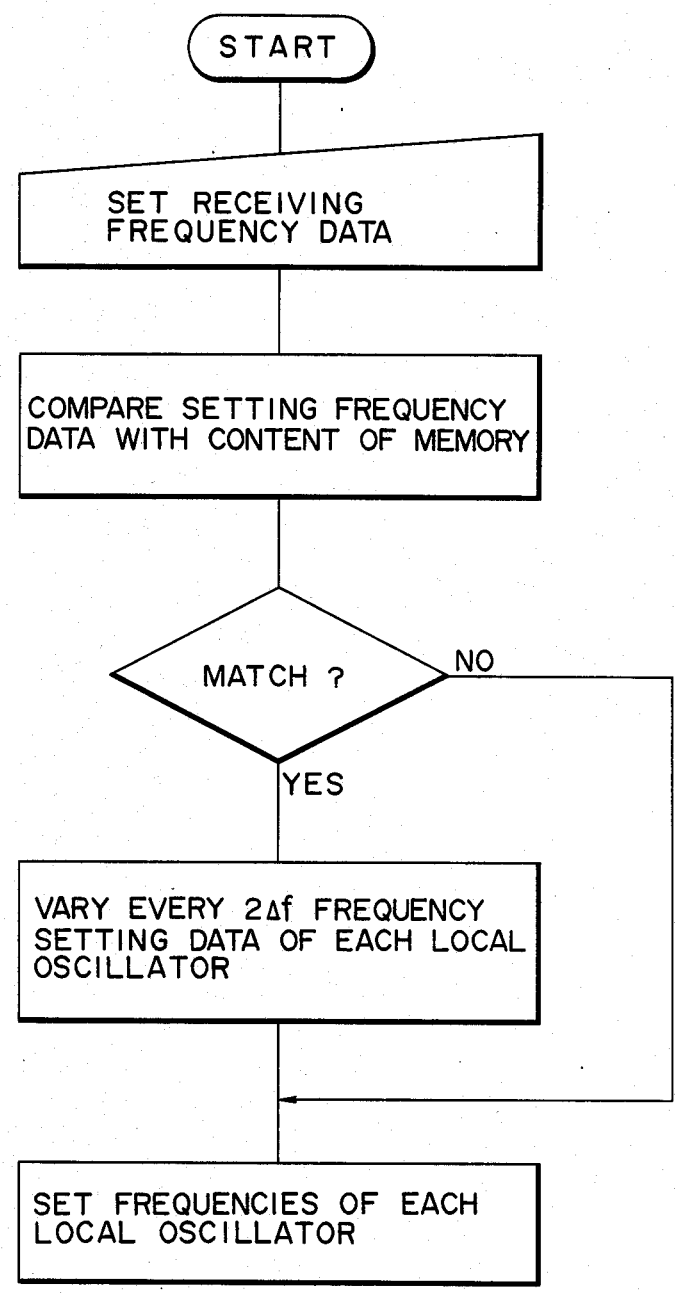
FIG. 3 is a flow chart for explaining the mode of operation of the embodiment shown in FIG. 2.

The mode of operation of the receiver having the above-mentioned configuration will be described with reference to the flow chart shown in FIG. 3.

First, receiving frequency setting data is input by, for example, detecting the rotational position of the receiving frequency setting dial at the operation unit 101. The input receiving frequency data is supplied to the high-frequency filter 11 through the I/O interface 102 and is converted to predetermined corresponding frequency characteristics. At the same time, the set receiving frequency data is supplied to the microprocessor 103 through the I/O interface 102. The microprocessor 103 reads out from the memory 104 receiving frequency data at which a residual spurious component is expected to occur and which is calculated in advance and stored in the memory 104. The microprocessor 103 checks if the readout receiving frequency data matches with the set receiving frequency data.

Noncoincidence or coincidence output from the microprocessor 103 is supplied to the first and second local oscillators 17 and 18 through the I/O interface 102. When a noncoincidence output is received, the variable capacitive elements for shifting local frequencies in the first and second local oscillators 17 and 18 are held at substantially zero offset so as to generate prescribed local frequencies fL1 and fL2. In this case, beat reception due to a residual spurious component will not occur and appropriate waves can be well received.

When a coincidence output is received, the first and second local oscillators 17 and 18 offset the variable capacitive elements for local frequency shifting by predetermined values so as to generate frequencies of $fL1-2\Delta f$ and $fL2-2\Delta f$ which are shifted from the prescribed local frequencies by $2\Delta f$.

For amplifying the second intermediate frequency fi2, the value of $\Delta f$ is selected to be about the bandwidth of the intermediate frequency amplifier 14.

This shift operation will be described with reference to the example of a residual spurious component as described above. When the bandwidth $\Delta f$ of the intermediate frequency amplifier 14 is 15 kHz at a receiving frequency of 321.025 MHz, if the first and second local frequencies fL1 and fL2 are shifted by $2\Delta f = 30$ kHz, the first and second intermediate frequencies fi1 and fi2 are given by:

$$fi1 = 2\times(fL1-0.03)-4\times(fL2-0.03)$$

$$fi2 = (fL2-0.03)-fi1$$

Substitution of fL1 = 520.775 MHz and fL2 = 210.45 MHz yields fi1 = 199.81 MHz and fi2 = 10.61 MHz.

In this manner, when the local frequencies fL1 and fL2 of the first and second local oscillators 17 and 18 are shifted by $2\Delta f = 30$ kHz, the second intermediate frequency fi2 10.7 MHz which would be under the influence of the residual spurious component is shifted to 10.61 MHz and can therefore be shifted outside the bandwith of the intermediate frequency amplifier 14.

On the other hand, the second intermediate frequency fi2 of the receiving frequency 321.025 MHz obtained by a normal circuit remains unchanged at 10.7 MHz. As a result, only the intermediate frequency component generated due to the residual spurious component is removed, and radio interference is prevented.

The first embodiment is described with reference to the case wherein a residual spurious component occurs in only one receiving band. However, if a residual spurious component is present in each receiving band, the receiving frequencies fs1, fs2, fs3, . . . , at which a residual spurious component occurs for the respective receiving bands are stored in the memory 104. These receiving frequencies fs1, fs2, fs3, . . . , are read out in synchronism with the respective bands and are supplied to the microprocessor 103.

A combination of a switch element operated by a noncoincidence or coincidence output from the microprocessor 103 with a capacitor or the like can replace the variable capacitive element for shifting the local frequency.

Figure 4:
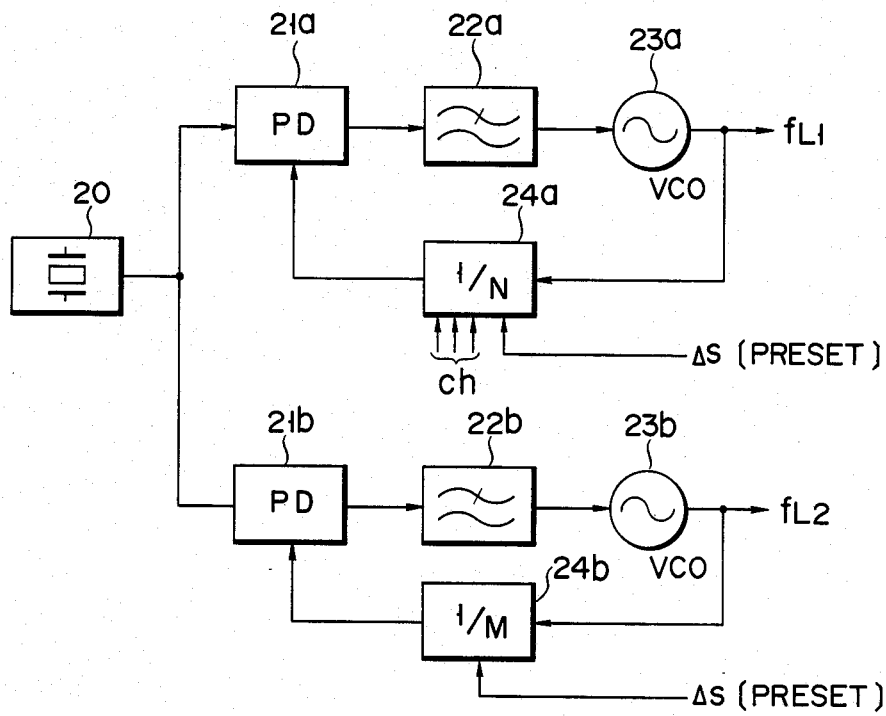
FIG. 4 is a block diagram of a main part of a multi-superheterodyne receiver according to a second embodiment of the present invention.

FIG. 4 shows a second embodiment of the present invention wherein the first and second local oscillators 17 and 18 comprise phase locked loop (PLL) circuits. Referring to FIG. 4, reference numeral 20 denotes a reference oscillator; 21a and 21b, phase detectors; 22a and 22b, low-pass filters; 23a and 23b, variable oscillators; and 24a and 24b, frequency dividers having variable frequency division ratios. In these PLL circuits, any desired frequencies can be generated by the variable oscillators 23a and 23b by properly setting the frequency division ratios N (M) of the frequency dividers 24a and 24b. Therefore, for example, when the frequency division ratio N of the frequency divider 24a is changed by a tuner, the local frequency fL1 of the first local oscillator 17 for receiving in a specific receiving band is generated by the variable oscillator 23a. When the frequency division ratio M of the frequency divider 24b is properly set, the local frequency fL2 of the second oscillator 18 is generated by the variable oscillator 23b.

When the frequency division ratios N and M of the frequency dividers 24a and 24b are changed by digital control by $+\Delta S$, respectively, the local frequencies fL1 and fL2 of the first and second local oscillators 17 and 18 are simultaneously shifted by $2\Delta f$ upon setting of a receiving frequency at which a residual spurious component occurs. Thus, the value of $\Delta S$ is preset by an output from the microprocessor 103.

In this manner, in the case of a receiver of digital control type in which frequency conversion is performed by PLL circuits or digital AFC circuits, design of a residual spurious removal circuit is simplified. In addition, the microprocessor 103, the memory 104, and the like, described above, can be integrally assembled in PLL circuits as IC circuits.

In the first and second embodiments, the first local oscillator 17 is variable according to setting of a receiving frequency, and the second local oscillator 18 is fixed unless offset to avoid a residual spurious component. However, the technical principle of the present invention can be applied to a receiver in which the first local oscillator 17 is fixed and the second local oscillator 18 is variable, or a receiver in which both the first and second local oscillators 17 and 18 are variable. Residual spurious noise can also be eliminated in a similar manner in these cases.

The judging and control sections assembled in the microprocessor 103 are mainly used to facilitate the judging (by matching with the memory content) of the set frequency even if the number of frequencies which generate residual spurious components is large. At the same time, the control section can easily calculate the local frequencies and set the frequencies in the local oscillators (including setting of the shift amount) in accordance with the judging result obtained. This not only simplifies the circuit configuration but also leads to a lighter and more compact receiver, lower power consumption and higher processing speed.

Figure 5:
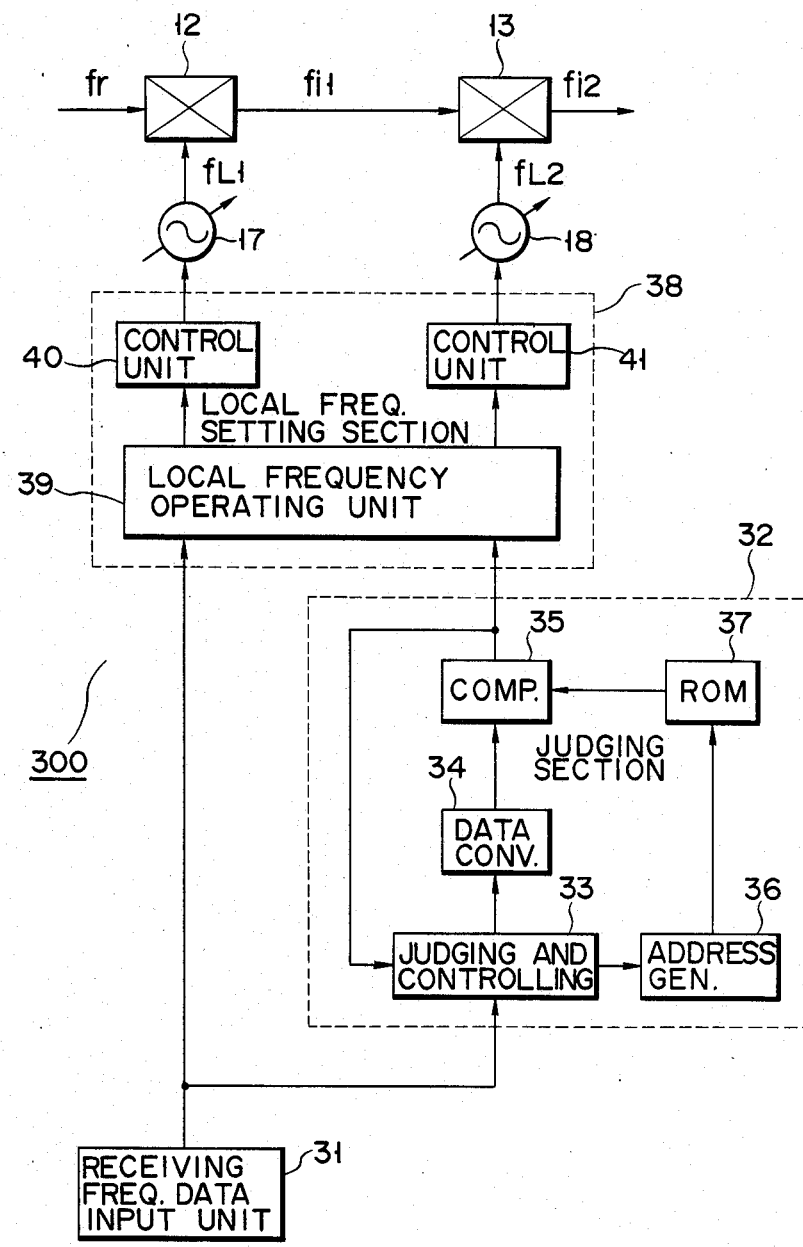
FIG. 5 is a block diagram of a main part of a multi-superheterodyne receiver according to a third embodiment of the present invention.

FIG. 5 shows a third embodiment of a detailed configuration of the controller 100 of the first embodiment. The same reference numerals as in FIG. 2 denote the same parts in FIG. 5.

A controller 300 of the third embodiment mainly has a judging section 32 and a local frequency setting section 38. In the judging section 32, receiving frequency data input from a receiving frequency data input unit 31 is supplied to one input terminal of a comparator 35 through a judging and control unit 33 and a receiving frequency data converter 34. The other input terminal of the comparator 35 receives a memory content of a ROM 37 which is accessed by an address signal generated by an address generator 36. It is to be noted that as in the case of the memory 104 of the first embodiment, receiving frequency data at which a residual spurious component is expected to occur and which is calculated in advance is stored in the ROM 37. Thus, the comparator 35 produces a coincidence or noncoincidence signal which represents whether the receiving frequency data will result in generator of a residual spurious component.

In the local frequency setting section 38, a local frequency operating unit 39 calculates a suitable local frequency in accordance with the receiving frequency data received from the receiving frequency input unit 31 and the coincidence or noncoincidence signal from the judging section 32. An operation result is supplied from the local frequency operating unit 39 to the first and second local oscillators 17 and 18 through first and second local frequency control units 40 and 41. In this manner, when the output from the judging section 32 is a noncoincidence signal, the local oscillators 17 and 18 generate prescribed local frequencies fL1 and fL2. However, when the output from the judging section 32 is a coincidence signal, the local oscillators 17 and 18 generate local frequencies fL1−2Δf and fL2−2Δf, respectively, which are shifted from the frequencies fL1 and fL2 by predetermined frequencies to remove a residual spurious component.

Figure 6:
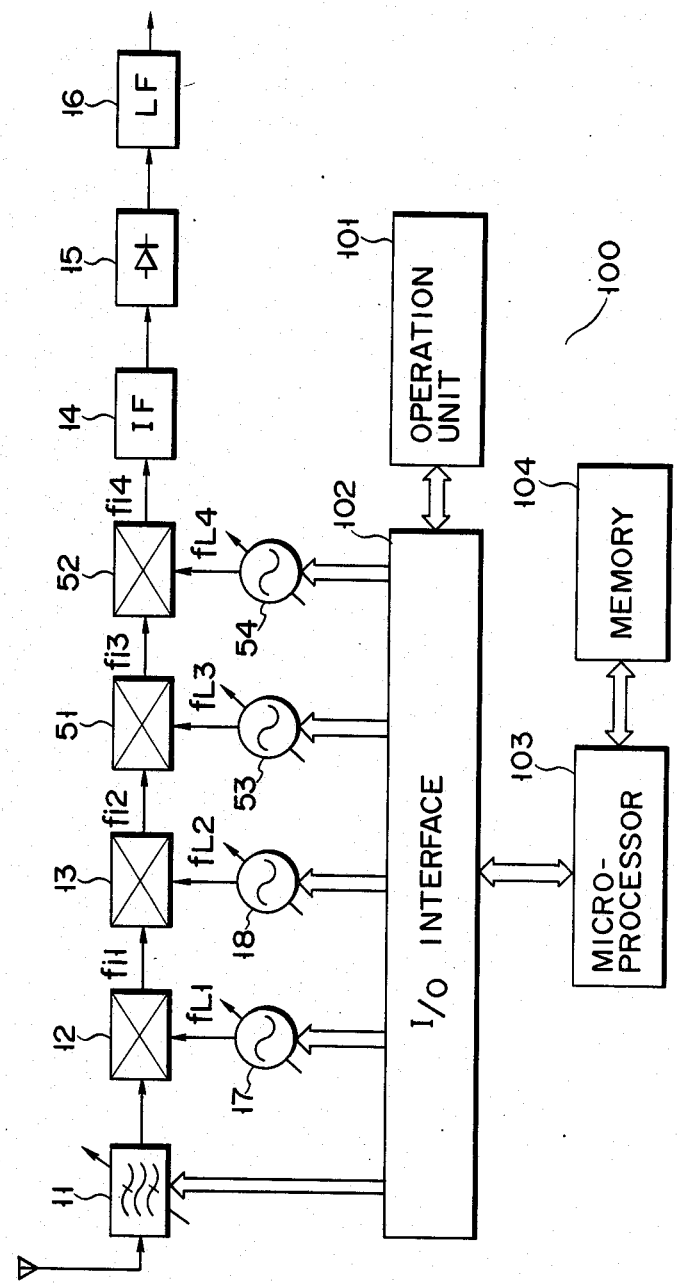
FIG. 6 is a block diagram of a main part of a multi-superheterodyne receiver according to a fourth embodiment of the present invention.

FIG. 6 shows a fourth embodiment of the present invention applied to a quadruple-superheterodyne receiver. The same reference numerals as in FIG. 2 denote the same parts in FIG. 6.

Figure 7:
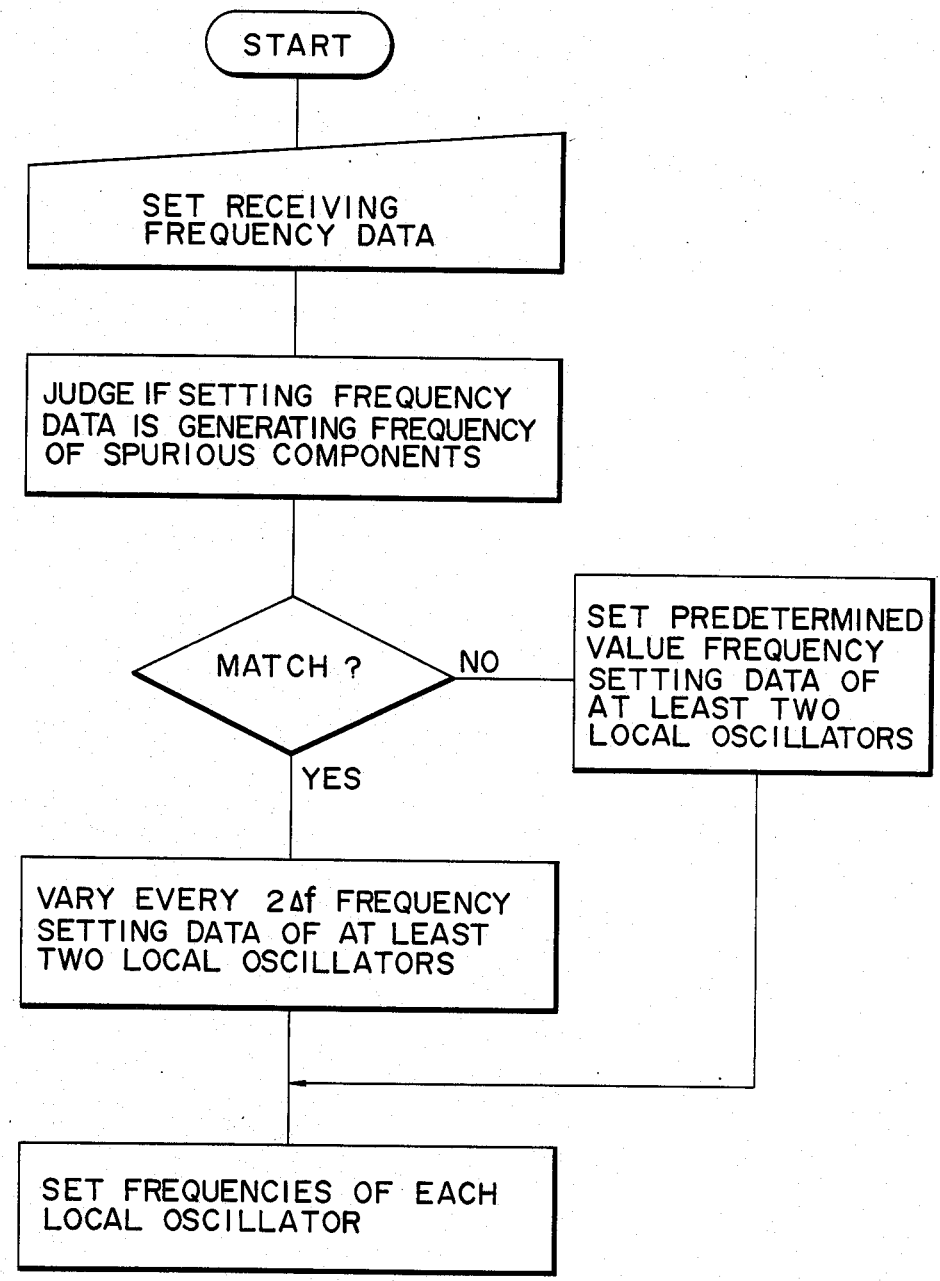
FIG. 7 is a flow chart for explaining the mode of operation of the embodiment shown in FIG. 6.

The fourth emodiment is basically the same as the first embodiment except that third and fourth frequency converters 51 and 52 and third and fourth local oscillators 53 and 54 are added. The receiver of the fourth embodiment is substantially the same as that of the first embodiment (FIG. 3), as can be seen from FIG. 7. However, note that local frequencies of at least two local oscillators within the first to fourth local oscillators 17, 18, 53 and 54 must be shifted. The amount of shift in this case must be selected so as not to change the final intermediate frequency.

The receiver of the present invention can be a receiver for receiving signals through a line. The shift frequency is not limited to 2Δf and can be one which is sufficient to shift a residual spurious component outside the bandwidth of the final intermediate frequency amplifier and one which does not change the final intermediate frequency. Frequencies can be shifted when the operator depresses a push button.

In order to judge if a set receiving frequency is a residual spurious component frequency, it need not always be compared with a value calculated in advance and stored in a memory. For example, it can be performed by judging in accordance with data on the intermediate bandwidth of a receiver and signal interference whether the set frequency is a frequency that will generate a residual spurious component.

As described above, when a receiver of the present invention is set in a receiving mode involving a residual spurious component, local frequencies of at least two local oscillators can be shifted by predetermined frequencies. For this reason, reception interference or erroneous reception of waves caused at specific frequencies can be prevented.

What is claimed is:
1. A multi-superheterodyne receiver, comprising:
means for setting data corresponding to a desired receiving frequency,
a first local oscillator for generating a first local frequency signal,
a first frequency converter for converting to a first intermediate frequency signal a received signal in response to said first local frequency signal,
a second local oscillator for generating a second local frequency signal,
a second frequency converter for converting to a second intermediate frequency signal said first intermediate frequency signal in response to said second local frequency signal,
memory means for storing preset receiving frequency data corresponding to receiving frequencies which can be set by said setting means and at which residual spurious components would be generated in a frequency passband of the receiver by active circuits in the receiver when said first and said second local oscillators generate said first and said second local frequency signals,
judging means for comparing the receiving frequency data set by said setting means with the preset receiving frequency data stored in said memory means, and for determining that a residual spurious component would result when the compared frequency data match one another; and control means for shifting the frequency of said first local frequency signal by a first predetermined frequency to cause said first intermediate frequency signal to suppress said residual spurious component, and for shifting the frequency of said second local frequency signal by a second predetermined frequency to maintain the frequency of said second intermediate frequency signal constant, when said judging means determines that a residual spurious component would be generated at the desired receiving frequency, wherein intermodulation disturbances are suppressed.

2. A receiver according to claim 1, wherein the frequencies shifted by said control means are set to be substantially double a bandwidth of an amplifying stage for amplifying the second intermediate frequency signal.

* * * * *

UNITED STATES PATENT AND TRADEMARK OFFICE
CERTIFICATE OF CORRECTION

PATENT NO. : 4,661,995
DATED : April 28, 1987
INVENTOR(S) : T. Kashiwagi

It is certified that error appears in the above-identified patent and that said Letters Patent is hereby corrected as shown below:

On the title page assignee should read

-- (73) Assignee: Anritsu Corporation --.

Signed and Sealed this

First Day of March, 1988

Attest:

DONALD J. QUIGG

*Attesting Officer*  *Commissioner of Patents and Trademarks*